(12) United States Patent
Matthew et al.

(10) Patent No.: US 7,749,662 B2
(45) Date of Patent: Jul. 6, 2010

(54) PROCESS MARGIN USING DISCRETE ASSIST FEATURES

(75) Inventors: Itty Matthew, Santa Clara, CA (US); Bhanwar Singh, Morgan Hill, CA (US)

(73) Assignee: GLOBALFOUNDRIES Inc., Grand Cayman, KY (US)

( * ) Notice: Subject to any disclaimer, the term of this patent is extended or adjusted under 35 U.S.C. 154(b) by 888 days.

(21) Appl. No.: 11/245,824

(22) Filed: Oct. 7, 2005

(65) Prior Publication Data

US 2007/0082277 A1   Apr. 12, 2007

(51) Int. Cl.
*G03F 1/00* (2006.01)

(52) U.S. Cl. .................. 430/5; 430/311; 430/394; 716/19; 716/21; 700/121

(58) Field of Classification Search ............ 430/5, 430/311, 394; 716/19, 21; 700/121
See application file for complete search history.

(56) References Cited

U.S. PATENT DOCUMENTS

| | | | |
|---|---|---|---|
| 5,436,095 A * | 7/1995 | Mizuno et al. | 430/5 |
| 5,821,014 A * | 10/1998 | Chen et al. | 430/5 |
| 6,406,819 B1 | 6/2002 | Lin | |
| 6,433,878 B1 * | 8/2002 | Niu et al. | 356/603 |
| 7,251,377 B2 * | 7/2007 | Liu | 382/274 |
| 2002/0045134 A1 | 4/2002 | Inoue et al. | |
| 2004/0091791 A1 | 5/2004 | Barber | |
| 2004/0161678 A1 * | 8/2004 | Misaka | 430/5 |
| 2004/0248016 A1 | 12/2004 | Lucas et al. | |
| 2004/0259042 A1 * | 12/2004 | Fritze et al. | 430/394 |
| 2005/0196686 A1 * | 9/2005 | Meyer et al. | 430/5 |

FOREIGN PATENT DOCUMENTS

| | | |
|---|---|---|
| EP | 1152288 A1 | 11/2001 |
| EP | 1447711 A2 | 8/2004 |
| WO | 98/38549 A1 | 9/1998 |
| WO | 98/38649 A1 | 9/1998 |

OTHER PUBLICATIONS

International Search Report dated Jan. 5, 2007, mailed Feb. 8, 2007, for PCT Application US2006/032916, 13 pages.

* cited by examiner

*Primary Examiner*—Mark F Huff
*Assistant Examiner*—Rashid Alam
(74) *Attorney, Agent, or Firm*—Turocy & Watson, LLP

(57) ABSTRACT

The subject invention provides a system and method for improving the process margin of a lithographic imaging system. The process margin improvement is achieved through the novel placement of discrete assist features and/or the use of forbidden pitches and specific pitch orientations. Novel geometries are utilized, which take advantage of line-end pull back and/or a lack of resolution of pitches perpendicular to an axis of a dipole illumination source. The strategic placement of a series of discrete scatterbar segments on a mask near positions of critical features, such as, for example, contacts, mitigates resist residue that can result from the use of a contiguous scatterbar.

19 Claims, 13 Drawing Sheets

PROCESS MARGIN USING DISCRETE ASSIST FEATURES

FIELD OF INVENTION

The subject invention relates generally to semiconductor devices and, in particular, to a method of improving process margin of a lithographic imaging process through the use of discrete assist features.

BACKGROUND OF THE INVENTION

In the semiconductor industry, there is a continuing trend toward higher device densities. To achieve these high device densities there have been, and continue to be, efforts toward scaling down device dimensions (e.g., at sub-micron levels) on semiconductor wafers. In order to accomplish such densities, smaller feature sizes and more precise feature shapes are required. This can include width and spacing of interconnecting lines, spacing and diameter of contact holes, and surface geometry, such as corners and edges, of various features. The dimensions of and between such small features can be referred to as critical dimensions (CDs). Reducing CDs and reproducing more accurate CDs facilitates achieving higher device densities.

High-resolution lithographic processes are used to achieve small features. In general, lithography refers to processes for pattern transfer between various media. In lithography for integrated circuit fabrication, a silicon slice, the wafer, is coated uniformly with a radiation-sensitive film, the photoresist. The film is selectively exposed with radiation (e.g., optical light, x-ray, electron beam, . . . ) through an intervening master template (e.g., mask, reticle, . . . ) forming a particular pattern (e.g., patterned resist). Dependent upon coating type, exposed areas of the coating become either more or less soluble than unexposed areas in a particular solvent developer. More soluble areas are removed with the developer in a developing step, while less soluble areas remain on the silicon wafer to form a patterned coating. The pattern corresponds to either the image of the mask or its negative. The patterned resist is used in further processing of the silicon wafer.

The achievement of smaller critical dimensions is related to the resolution of the lithographic system. Efforts to increase resolution and thereby reduce critical dimensions can be accomplished by several approaches. One approach involves the reduction in wavelength of the exposure radiation such as is achieved by moving from mercury g-line (436 nm), to excimer laser (193 nm), and further to 157 nm, 90 nm, 65 nm, etc. A second approach involves improvements in optical designs, manufacturing techniques, and metrology. Such improvements have lead to increased resolution through an increase in numerical aperture. A third approach involves the utilization of various resolution enhancement techniques. The use of phase shifting masks and off-axis illumination techniques have led to improved resolution through a reduction in the lithographic constant "k" of the imaging system.

In low k imaging systems, a significant portion of the transmitted light energy is carried in high spatial frequency components of the mask spectrum. In general, these high spatial frequency components are not captured by the low-pass pupil of an imaging system. The loss of the high spatial frequency components results in images that are distorted in one or more ways from the original. Image distortion includes such effects as line shortening, corner rounding, non-linearity and proximity effects where, for example, imaged line width can vary as a function of spacing between adjacent lines. Image distortions can result in images that are of insufficient fidelity to satisfy their intended function. Methods to correct or offset such distortions can increase the process margin thereby improving efficiency of the system.

Optical proximity correction (OPC) is one particular methodology that can be employed to compensate for known pattern distortions. OPC is employed to compensate mask geometry for known effects that can occur during imaging. The utilization of OPC can provide improved line-width uniformity allowing for faster clock rates and better overall circuit performance. OPC can also enhance an imaging process window and thereby provide a higher yield. One OPC technique involves the addition of assist features to a mask that enable more consistent imaging of a desired pattern. However, the presence of assist features can result in the formation of an undesirable resist residue, which negatively impacts the yield of a lithographic process. Inhibiting the formation of resist residue can significantly improve the yield of a lithographic imaging process.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The subject invention provides a system and method for improving process margin of a lithographic imaging system. One factor that impacts the process margin of a lithographic system is referred to as proximity effect. Proximity effect refers to variations in printed features that have the same set of nominal critical dimensions as a result of environmental variations. A change in pitch is one example of a change in an environmental condition or an environmental variation. An example of a proximity effect is a variation in line width that results as a function of changes in pitch. For a given nominal line width, the spacing between adjacent lines is increased as pitch is increased. Variations in pitch can result in variations on the order of 15% in printed line width. Such variations in pitch are manifest in masks that comprise areas containing a relatively dense concentration of features and areas containing a relatively sparse concentration of features. In some cases, a scatterbar can be utilized to help control the pitch and resulting line width variation. However, a resist residue can form as a result of partial exposure of the resist from light diffracted at the edges of the scatterbar. The presence of such a resist residue can negatively impact the yield of the system.

In accordance with one aspect of the subject invention, novel geometries for subresolution assist features are utilized to change the environment and thereby reduce variations in printed line width which otherwise might negatively impact the transfer of a mask pattern onto a wafer. In accordance with one or more aspects of the subject invention, light diffracted from the edges of the novel subresolution assist features placed near semi-isolated features provides a beneficial interaction with light associated with the semi-isolated feature. The resulting printed line width is more consistent with the printed line width produced by areas of the mask comprising higher feature density. Furthermore, the light diffracted from the novel subresolution assist features does not result in a partial exposure of a portion of a resist and thereby does not create an undesirable resist residue after removal of the resist layer.

In accordance with one aspect of the subject invention, process margin improvement is achieved through the placement of discretized subresolution assist features. In accordance with this aspect, discretized scatterbars are utilized and placed in such a manner as to avoid the formation of resist residue. A discretized scatterbar is a scatterbar that can comprise a series of more than one discrete scatterbar segments. In accordance with a related aspect, dimensions of the discrete scatterbar segments are selected to capitalize on line-end pull back to avoid the formation of resist residue. Line-end pull back, also called line shortening, refers to the fact that printed length of a line on a wafer is often less than the length of the line on the mask. Line-end pull back can be the result of diffraction, mask pattern rounding and/or diffusion of chemicals in the resist. The ends of the line experience pull back and the resulting line imaged into the resist is shorter than the line in the mask.

In accordance with this aspect of the subject invention, the placement and dimensions of the discrete scatterbar segments can be selected such that the discretized scatterbars will not be printed onto the resist layer, and furthermore, can mitigate formation of resist residue that can limit yield on the resulting wafer. The placement of the discretized scatterbar facilitates decreasing in pitch to the optical system with respect to printing of adjacent features. The printed critical dimensions of the adjacent features are therefore more consistent with the critical dimensions achieved for the balance of the features of the mask. Furthermore, the undesirable formation of resist residue can be avoided as a result of the line-end pull back caused by diffraction of light at the ends of each discrete scatterbar segment.

In accordance with another aspect of the subject invention, discrete scatterbar segments are created utilizing "forbidden" pitches to avoid formation of resist residue. Forbidden pitches refer to pitches that can result in a degradation of the process window for a lithographic imaging system. The addition of assist features to alter the apparent density and pitch as seen by the projection system can result in a sudden reduction or downward spike in the process window for a given span of pitches. The pitch values where the process window has a downward spike and falls below a threshold value are referred to as forbidden pitches. These pitches are "forbidden" to be used in the layout of a desired pattern because of the undesirable reduction in the process window that such pitches can cause. However, in accordance with an aspect, placement of discrete scatterbar segments at forbidden pitches can provide the process benefits of improved critical dimension control for an adjacent feature and can also mitigate the creation of resist residue, which can otherwise have a deleterious affect on the yield of a resulting processed image.

In accordance with another aspect of the subject invention, novel geometries are provided which take advantage of a lack of resolution of pitches perpendicular to an axis of a dipole illumination source. In accordance with this aspect, a dipole illumination source is used such that the resolution of the imaging system in an axis perpendicular to the dipole will be less than the resolution in the direction parallel to the axis of the dipole. This disparity in resolution allows for a tight pitch to be used for placement of a series of features, such as, for example, wordlines, while the same pitch can be used for scatterbar segments running perpendicular to the axis of the dipole without the creation of resist residue. The lack of resolution in the direction perpendicular to the axis of the dipole allows for the scatterbar feature sizes to be on the same order in length as a width of an underlying bitline, yet still be unresolved by the imaging system.

In accordance with one aspect of the subject invention, discrete scatterbar segments are placed perpendicular to a wordline to maintain critical dimension control while avoiding the formation of resist residue. In one aspect, the discrete segments comprise a grating placed at a pitch consistent with a bitline pitch, which permits placement of discrete scatterbar segments directly above bitline contacts. In accordance with this aspect, the pitch of the elements comprising the grating is oriented in a direction perpendicular to the axis of a dipole illumination source at a pitch that need not be resolved by the imaging system. The dimensions of the grating elements can be such that they will not be printed or result in the formation of a resist residue.

In accordance with yet another aspect of the subject invention, the size, spacing and placement of the discrete scatterbar segments can be determined through simulation. The diffraction interactions of light passing through a mask are complex, and simulations can aid in determining an optimal placement of discrete scatterbar segments and for further determining a resulting depth of focus for the system.

To the accomplishment of the foregoing and related ends, certain illustrative aspects of the invention are described herein in connection with the following description and the annexed drawings. These aspects are indicative, however, of but a few of the various ways in which the principles of the invention can be employed and the present invention is intended to include all such aspects and their equivalents. Other advantages and novel features of the invention will become apparent from the following detailed description of the invention when considered in conjunction with the drawings.

DETAILED DESCRIPTION OF THE INVENTION

Figure 1:
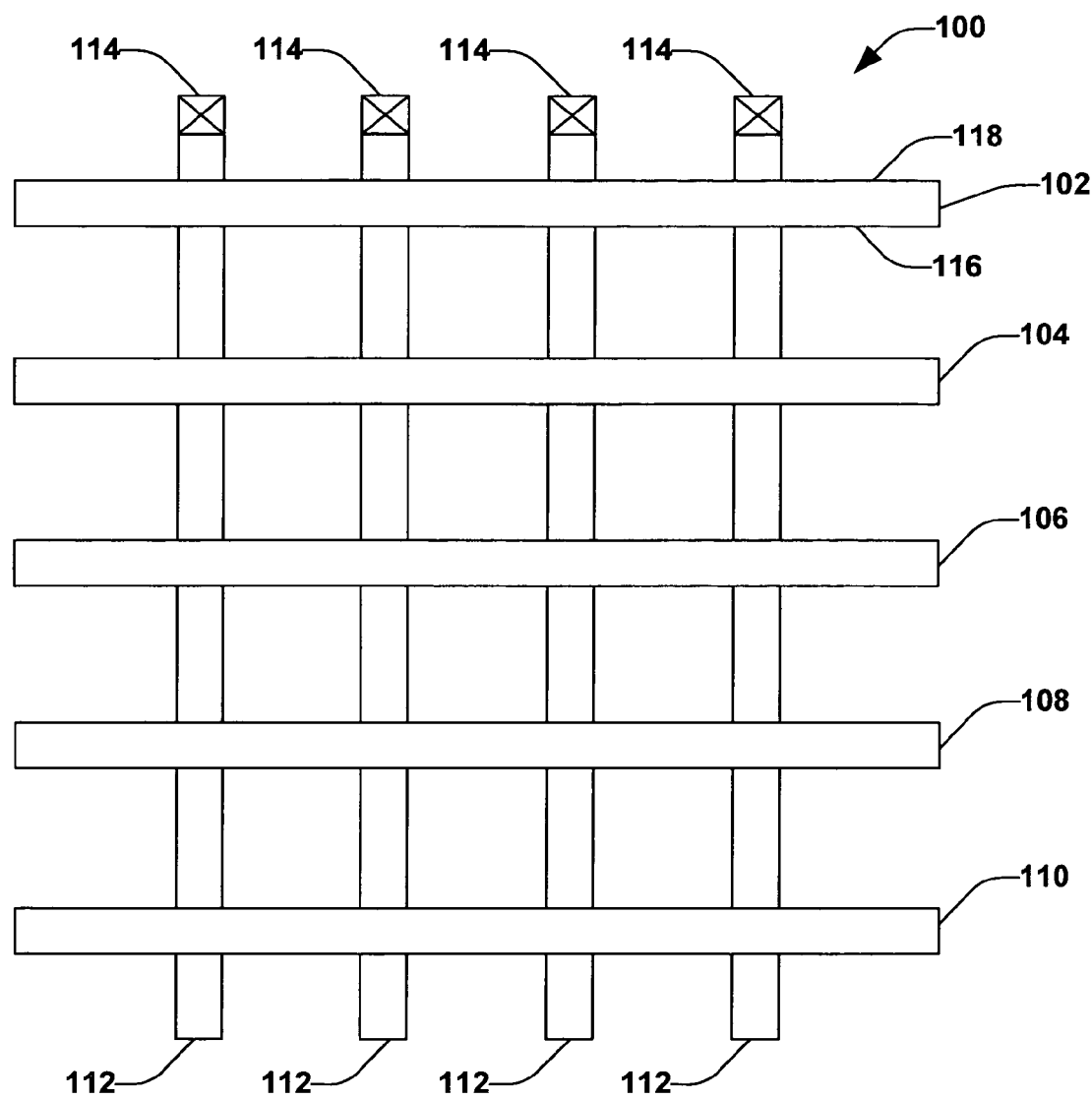
FIG. 1 is an illustration of an arrangement of bitlines and wordlines that can be formed on a typical wafer utilized in the manufacture of a memory component.

The invention will now be described with reference to the drawings, wherein like reference numerals are used to refer to like elements throughout. The invention will be described with reference to systems and methods that facilitate providing a discretized scatterbar that improves process margin. The discretized scatterbar provides the benefits of more consistent critical dimensions for semi-isolated features without the formation of a resist residue. It should be understood that the description of these exemplary aspects are illustrative and should not be taken in a limiting sense.

The term "component" can refer to a computer-related entity, either hardware, a combination of hardware and software, software, or software in execution. For example, a component can be a process running on a processor, a processor, an object, an executable, a thread of execution, a program and a computer. By way of illustration, both an application running on a server and the server can be components. A component can reside in one physical location (e.g., in one computer) and/or can be distributed between two or more cooperating locations (e.g., parallel processing computer, computer network). The term pitch refers to the sum of the line width and the spacing between the lines of a repeating pattern.

The subject invention provides a system and method for improving the process margin of a lithographic imaging system. The process margin improvement is achieved through the placement of discrete assist features sized and positioned utilizing novel geometries that prevent the formation of resist residue, which often results from the use of a single contiguous scatterbar. The dimensions and spacing of discretized scatterbars comprising discrete scatterbar segments capitalize on line-end pull back, forbidden pitches, and/or or a lack of resolution in an axis perpendicular to a dipole illumination source, in order to mitigate partial exposure of a resist layer which can result in the formation of a process limiting resist residue.

FIG. 1 is an illustration of bitlines and wordlines that can be formed on a typical wafer 100 utilized in the manufacture of a memory component. Memory components comprise individual memory cells, wordlines, bitlines and control circuitry to control the function of the memory component. The wafer 100 is comprised of a plurality of wordlines 102, 104, 106, 108, 110 and a plurality of bitlines 112. Coupled to each bitline 112 is a contact 114. The contacts 114 facilitate connection of the bitlines 112 to other circuitry such as, for example, control circuitry for controlling the writing to or reading from a memory cell positioned between a wordline and a bitline. In the manufacture of wafer 100, the proximity of wordline 102 next to contacts 114 presents itself as a process window limiter. The presence of the bitline contacts 114 results in a break in a pitch associated with the repetitive pattern formed from a series of wordlines, 102, 104, 106, 108, 110. This break in pitch can interrupt diffraction patterns that result from light passing through a mask utilized in the formation of a layer comprising the wordlines.

In a lithographic imaging process, the printing of wordline 104 can be influenced by printing of adjacent wordlines 102 and 106. The image of wordline 104 formed on a resist layer is the result of exposure light passing through a patterned mask that delineates wordline features. An image that is formed on the resist for wordline 104 can be generated via exposure light that is presented through a mask (e.g., a positive photomask, a negative photomask, . . . ), which can be augmented by and/or aggregated with exposure light that diffracts from edges of nearby or adjacent mask pattern features, such as, for example, mask pattern features corresponding to wordlines 102 and 106. However, according to this example, wordline 102 is the last wordline in a series of wordlines and therefore has an adjacent wordline, wordline 104, on only one side. Therefore, in the case of wordline 102, a formation (e.g., exposure, development, . . . ) of a first edge 116 of wordline 102 can be influenced by errant exposure light employed to form corresponding wordline 104, while a second edge 118 of wordline 102 does not have a corresponding adjacent wordline to influence its formation. As a result, there is no interaction on the resist layer of light that develops edge 118 with diffraction light from other features in the mask pattern, and the printing of the wordline 102 is therefore performed in a manner different from wordlines more than one neighboring wordlines. Thus, wordline 102 can exhibit a line width that deviates from desired critical dimensions, which in turn can adversely impact the performance of the manufactured memory device.

Figure 2:
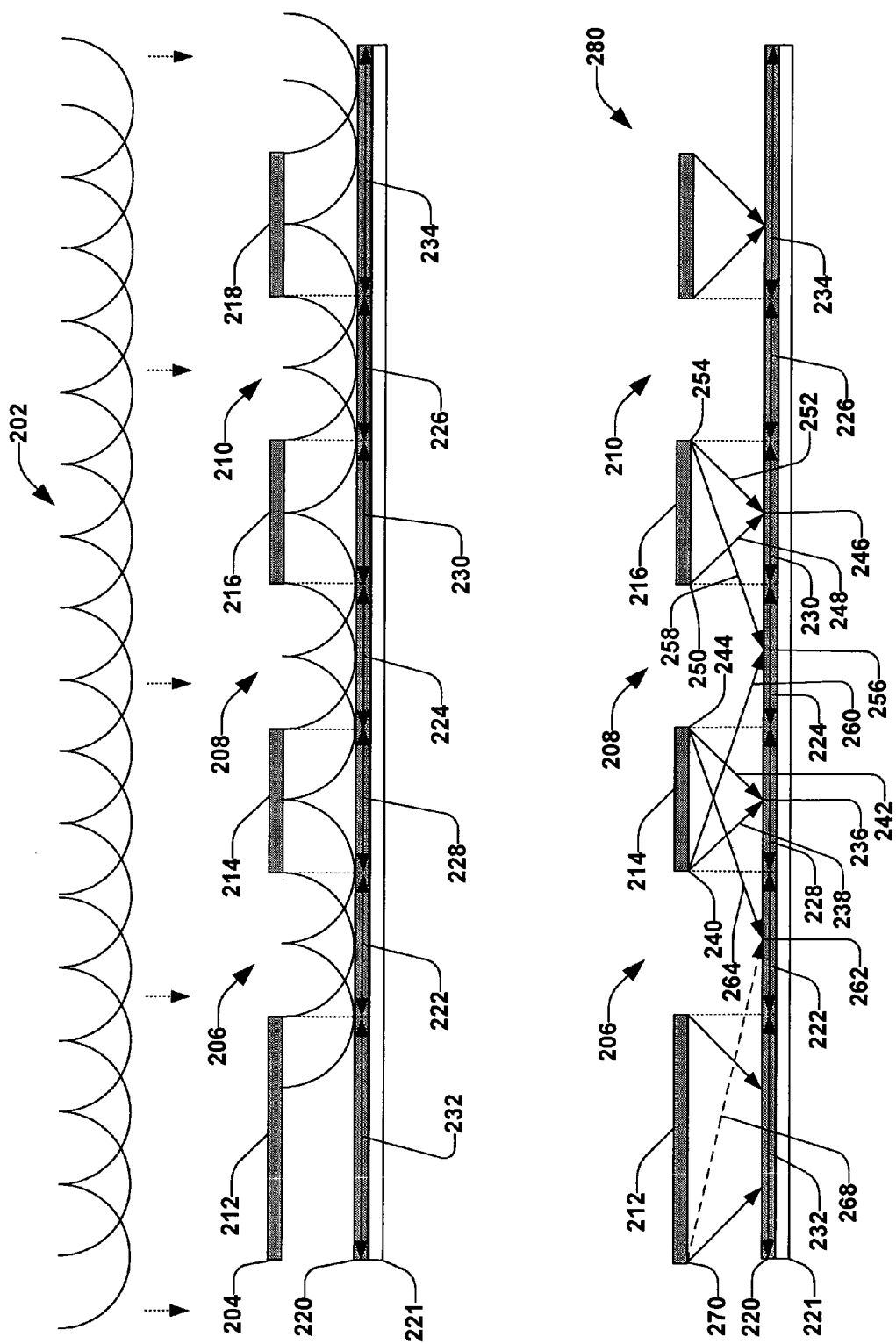
FIG. 2 is an illustration of diffraction effects of light as a wave of light passes through a mask.

FIG. 2 is an illustration of diffraction effects as a light wave 202 passes through a mask 204. FIG. 2 illustrates a manner in which exposure of a resist layer 220 on a wafer 221 can be influenced as a result of varied pitch associated with the feature pattern apertures on the mask 204. Moreover, as depicted, exposure light diffraction effects a terminal wordline or bitline can differ when compared to wordlines/bitlines that have two neighboring structures. A light wave 202 is illustrated as it approaches the mask 204, as indicated by vertical arrows oriented toward mask 204. The mask 204 is comprised of translucent areas 206, 208, 210 and opaque areas 212, 214, 216, 218. Either the opaque areas or the translucent areas can represent a desired pattern of wordlines or bitlines, depending upon the type of resist utilized. As the light wave 202 passes through the mask 204, light incident upon the translucent areas will pass through the mask while light incident on the opaque areas will be blocked. Light passing through the mask exposes the resist layer 220 of the wafer 221. More specifically, ignoring the effects of diffraction, light that passes through translucent area 206 will be incident upon resist area 222; light that passes through translucent area 208 will be incident upon resist area 224; and light that passes through translucent area 210 will be incident upon resist area 226. Furthermore, still ignoring the effects of diffraction, light incident upon opaque areas 212, 214, 216, and 218 will be blocked and inhibited from reaching resist areas 232, 228, 230, and 234, respectively However, in practice, light incident upon the various areas of resist layer 220 is impacted by diffracted light from edges between the translucent areas and the opaque areas of the mask 204. An examination of the light wave 202 as it travels and becomes incident upon the resist layer 220 reveals that resist layer areas 224 and 226, corresponding to translucent mask areas 208 and 210 respectively, receive a similar exposure, but resist layer area 222, corresponding to translucent mask area 206 receives a different exposure level. This difference in exposure level is due to the fact that a pitch of features on mask 204 has changed, resulting in a change in diffraction patterns of light reaching the resist layer.

Resist layer areas 228 and 230, corresponding to opaque mask areas 214 and 216, respectively, are not completely unexposed, but rather receive an amount of exposure from light that is diffracted at edges between the translucent areas and the opaque areas of the mask 204. An examination of resist layer area 232 however, reveals that it receives a different exposure level than the similar resist layer areas 228 and 230 due to the fact that the pitch has changed in the mask. Further, the difference in exposure between resist layer area 224 and adjacent resist layer area 228 will be substantially identical to the difference in exposure between resist layer area 224 and the adjacent resist layer area 230. However, the difference in exposure between resist layer area 222 and the adjacent resist layer area 228 will not be substantially identical to the difference in exposure between resist layer area 222 and the adjacent resist layer area 232. This disparity affects the quality of the critical dimensions for the feature associated with resist layer area 222. This is effectively the situation that exists for the last wordline illustrated as wordline 102 in FIG. 1.

The impact of diffraction is further illustrated by wafer/mask combination 280 showing light diffraction patterns on the wafer 220. Center area 236 of resist layer area 228 located directly under opaque mask area 214 will be illuminated by light 238 diffracting from edge 240 of opaque mask area 214. Furthermore, the center area 236 of resist layer area 228 can be illuminated by light 242 diffracting from edge 244 of opaque mask area 214. The total exposure received in area 228 is a summation of diffracted light from all sources, which includes light diffracted from the edges of adjacent and/or nearby opaque mask areas. Similarly, center area 246 of resist layer area 230 located directly under opaque mask area 216 will be illuminated by light 248 diffracting from edge 250 of opaque mask area 216. Furthermore, the center area 246 of resist layer area 230 will be illuminated by light 252 diffracting from edge 254 of opaque mask area 216. The total exposure received in center area 246 is a summation of the diffracted light from all sources, which includes light diffracted from the edges of adjacent and/or nearby opaque areas of the mask pattern.

Light diffracted at various edges of opaque mask pattern areas can also add to the exposure of resist layer areas under the translucent pattern areas such as, for example, resist layer area 224 located under translucent mask area 208. For example, center area 256 of resist layer area 224 is exposed by light 258 diffracted from edge 254 of opaque mask area 216. Furthermore, center area 256 is exposed by light 260 diffracted from edge 240 of opaque mask area 214. It can be seen that the exposure of the resist layer areas is not only a function of the light which passes through the translucent areas of the mask pattern corresponding to respective resist layer areas, but is also a function of diffracted light from all sources, including edges of adjacent and/or nearby opaque mask pattern areas.

When a mask pattern has a uniform pitch with uniform critical dimensions, the exposure of a resist layer of a wafer by light emitted through the mask can have a consistent effect across similar areas of the mask pattern. However, when the mask pattern pitch is varied between pattern features, as is the case for the mask pattern feature corresponding to the wordline 102 of FIG. 1, a diffraction pattern on the resist layer of the wafer for both the exposed area of the resist and an adjacent unexposed area will be different when compared to corresponding exposed and unexposed areas using a standard pitch. Returning to the wafer/mask combination 280, center area 262 of resist layer area 222 is exposed by light 264 diffracted from edge 244 of opaque mask area 214. In this example, where a pitch in the mask pattern has changed, center area 262 can also be exposed by light 268 diffracted from edge 270 of opaque mask area 212. However, light 268 traveling from edge 270 must travel farther to reach the center 262 of resist layer area 222 than light 260 must travel to reach the center area 256 of adjacent resist layer area 224. The difference in distance will affect both the phase and intensity of the light reaching the center area 262, and therefore the exposure of center area 262 will be different than center area 256. In cases where a translucent mask pattern area, such as, for example, translucent mask area 206, corresponds to a last wafer feature (e.g., wordline, bitline, . . . ), edge 270 will not diffract light, and therefore diffracted light 268 will not be present to add to the exposure in resist layer area 222. The disparity in exposure levels resulting from the different diffraction patterns affects the quality of the critical dimensions and is an example of what is often referred to as "proximity effect," which can result from a pitch variation in mask patterns.

Proximity effect refers to variations in printed features that have substantially the same set of nominal critical dimensions as a result of environmental variations. An example of a proximity effect is a variation in line width that results as a function of pitch. For a given nominal line width, the spacing between adjacent lines is increased as pitch is increased. A change in pitch is an example of a change in environmental conditions or an environmental variation. Variations in pitch can result in variations on the order of 15% in printed line width. Such variations in pitch are manifest in a mask where areas containing a relatively dense concentration of mask features transition to areas containing relatively sparse concentration of features. Semi-isolated features refer to mask features in an area containing a relatively sparse concentration of features or to the last, or terminal, mask feature in a series of densely populated areas. For semi-isolated mask features, the addition of assist features (e.g., discretized scatterbars, . . . ) adjacent to the semi-isolated features can alter the pitch of the semi-isolated features, thereby resulting in a more uniform line spacing consistent with mask features in areas of high feature density. The presence of such assist features on a mask alters diffraction pattern formation in areas near the semi-isolated features such that the diffraction patterns can be made more consistent with diffraction patterns where the features are relatively dense. The result is that critical dimensions are more consistent through various degrees of focus regardless of feature density. When such assist features are added, they generally comprise a line width narrower than a nominal line width of a desired feature such that the assist features will not be resolved by an imaging system and printed onto the wafer. However, with the addition of an assist feature, a resist residue can be created, which can negatively impact the yield or performance of the resulting circuit. In order to mitigate undesirable resist residue formation, line-end pull back can be manipulated/employed, as detailed infra with regard to the subsequent figures.

Figure 3:
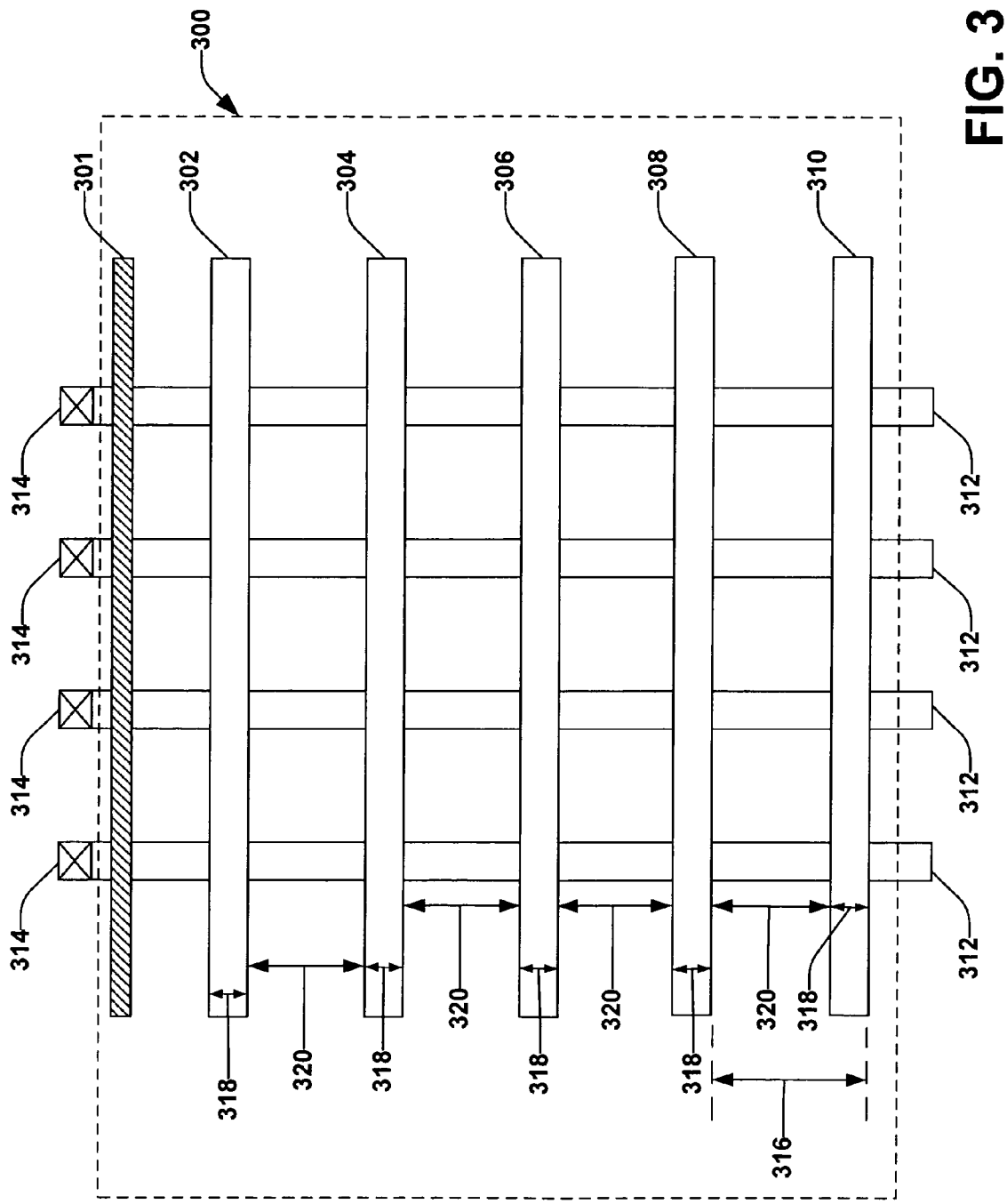
FIG. 3 is an illustration of a mask comprised of wordline pattern features and a scatterbar.

FIG. 3 illustrates a mask 300 comprised of wordline pattern features 302, 304, 306, 308, and 310. The mask 300 is positioned above a wafer comprised of bitlines 312 and contacts 314. The mask 300 further comprises a conventional scatterbar 301 (e.g. a subresolution assist feature) positioned between wordline feature 302 and contacts 314. A pitch 316 of the wordline features 302, 304, 306, 308, and 310 is comprised of a line width 318 plus a spacing 320 between adjacent wordline pattern features. The presence of scatterbar 301 at the spacing 320 augments the pitch with respect to wordline feature 302, thereby providing a pitch for wordline feature 302 that is consistent with pitches for wordline features 304, 306, and 308. Without the presence of scatterbar 301, the pitch for wordline pattern feature 302 would be inconsistent with pitches for wordline features 304, 306, and 308. With the presence of scatterbar 301, wordline feature 302 can retain a common line width 318 with the balance of the wordline features 304, 306, 308, and 310. Furthermore, the spacing 320 between wordline feature 302 and adjacent wordline feature 304 can be made consistent with the spacing between other adjacent pairs of wordline features. In order to mitigate undesired resist residue formation that can occur as a result of utilizing a scatterbar technique, line-end pull back can be manipulated, as described infra.

Resist residue can form as a result of partial exposure of the resist from light diffracted at the edges of the scatterbar 301. Diffracted light can provide a beneficial interaction with the exposure light associated with an adjacent feature at an end of a pattern (e.g., a last wordline in a series of wordlines being formed on a wafer, . . . ), such that the resulting printed line width of the adjacent feature is consistent with the line width printed in more densely populated portions of the mask. However, light diffracted from the scatterbar 301 can also result in an undesirable partial exposure of a portion of the resist area associated with the scatterbar 301, thereby creating an unwanted resist residue upon removal of the resist layer. The presence of such a resist residue negatively impacts the yield of the resulting printed wafers.

Figure 4:
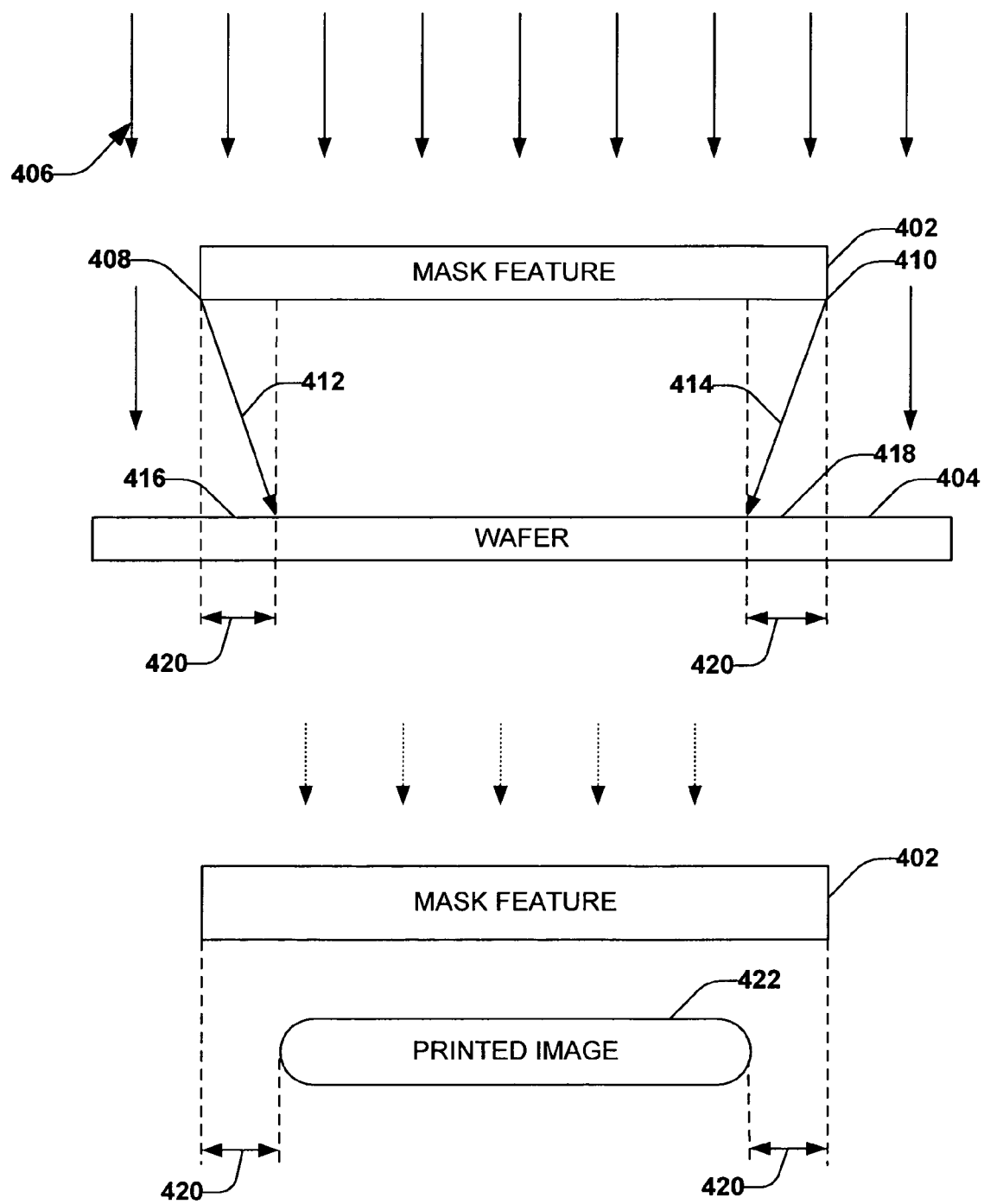
FIG. 4 is an illustration of the effects of diffraction on line-end pull back or line shortening.

FIG. 4 is an illustration of a wafer during exposure and a printed image that exhibits line-end pull back after exposure to direct and diffracted exposure light. A wafer undergoing exposure can comprise a mask feature 402, such as, for example, an opaque portion of a mask pattern that corresponds to a line to be imaged onto a resist layer of a wafer 404. During exposure, light 406 traveling towards the wafer 404 will be blocked by opaque portion 402. However, light incident at the edges 408 and 410 of the mask feature 402 is diffracted. Diffracted light 412 and 414 can be bent towards the center of the feature 402 and can expose portions 416 and 418 of wafer 404, which would otherwise be obscured from exposure by the opaque mask feature 402. As a result of diffraction, a printed image 422 of mask feature 402 is shortened at each end by an amount illustrated by 420.

Figure 5:
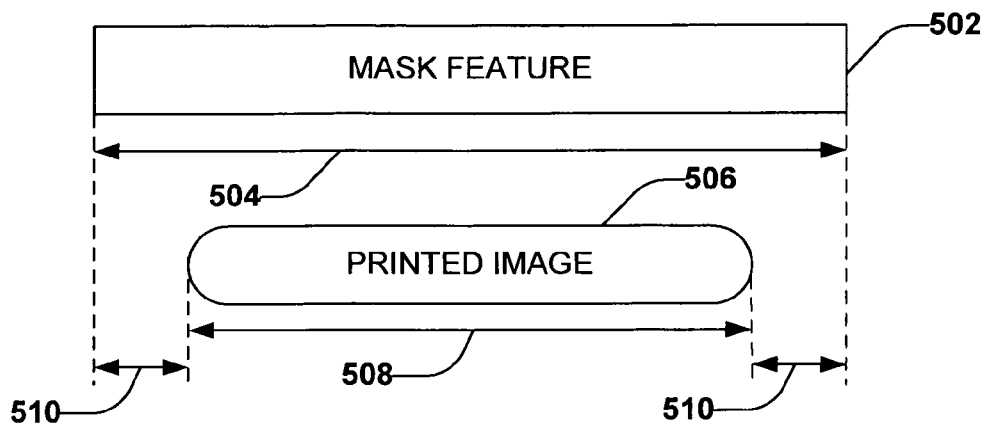
FIG. 5 illustrates a relationship between line feature size and printed image size, and the effects of line-end pull back.
Figure 5:
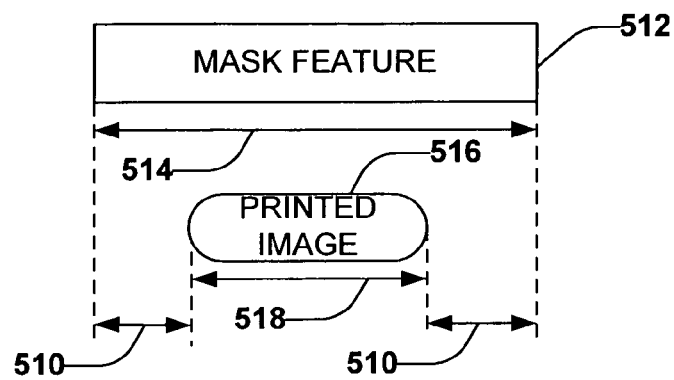
Figure 5:
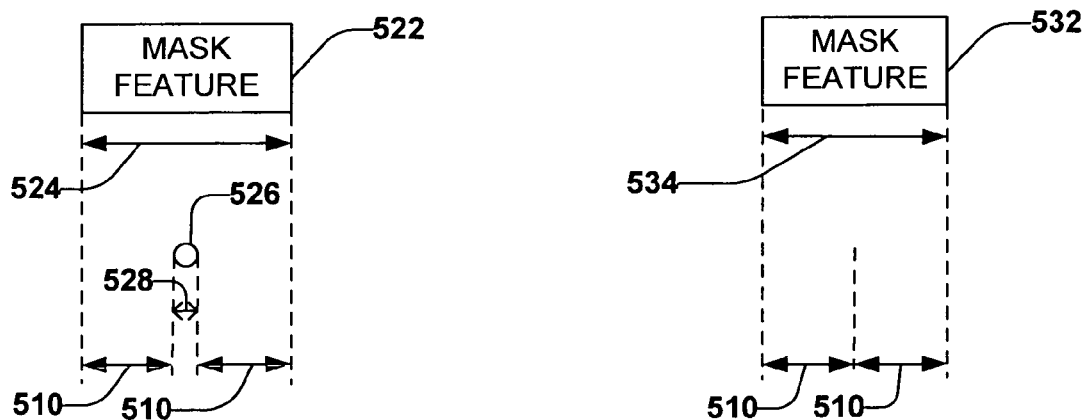

FIG. 5 further illustrates a plurality of mask pattern features and corresponding printed images that depict a relationship between mask pattern feature size and a printed image size as constrained by a line-end pull back phenomenon. For example, as a mask feature becomes smaller, a corresponding printed image becomes smaller, and the effects of line-end pull back become more pronounced. When the length of the mask feature becomes small enough, in accordance with one aspect of the invention, the diffraction effects will result in no image being printed upon the wafer and no resist residue being formed in a resist layer. For instance, FIG. 5 illustrates a mask line feature 502 of a nominal length 504. Due to diffraction at the ends of the line feature 502, the projected image 506 will be printed at a nominal length 508 that is less than nominal length 504. Each end of the printed image 506 has been shortened by a distance 510. Similarly, mask line feature 512 of nominal length 514 will result in a projected image 516 of nominal length 518. Again, each end of the printed image has been shortened by an amount 510. According to another example, mask line feature 522 is barely resolved as printed image 526 of length 528. Once again, each end of the printed image has been shortened by an amount 510. Mask line feature 532 is illustrated as being sufficiently small (e.g., of a sub-resolution size, . . . ) such that diffraction at each end of the line will result in the diffracted light meeting or overlapping on the wafer, which in turn can result in a lack of a printed image.

Figure 6:
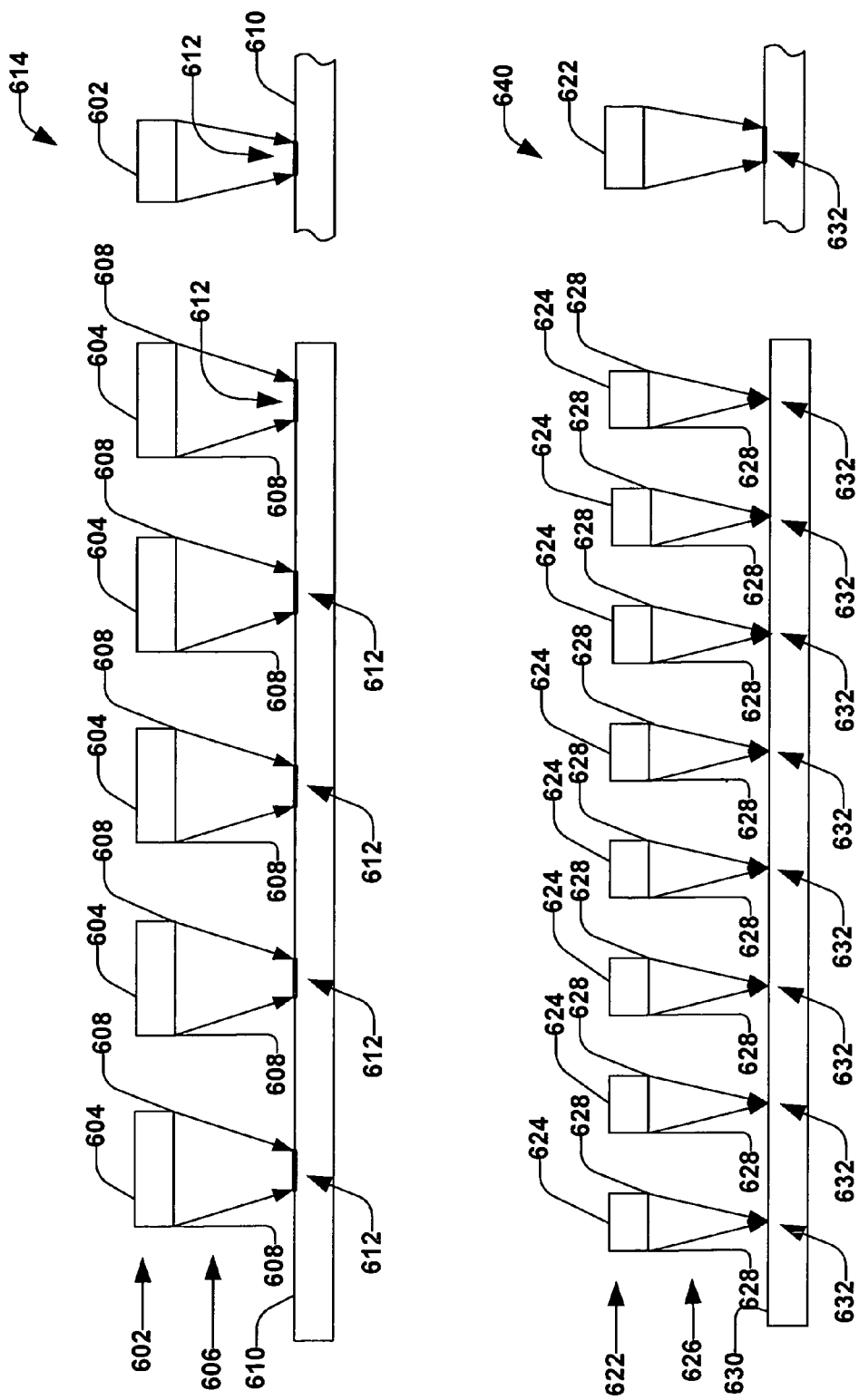
FIG. 6 is an illustration of a mask comprising a discretized scatterbar in accordance with an aspect of the subject invention.

FIG. 6 illustrates a discretized scatterbar that takes advantage of line-end pull back to mitigate formation of a resist residue often associated with a contiguous scatterbar, in accordance with an aspect of the subject invention. According to the figure, a discretized scatterbar 602 is comprised of a series of discrete scatterbar segments 604. As light 606 passes by the discrete scatterbar segments 604, the light 606 can be diffracted at edges 608 of each of the discrete scatterbar segments 604. As a result of diffraction at the edges 608 of the scatterbar segments 604, light incident on wafer 610 can expose a resist layer on the wafer 610 to generate a printed image 612 of each scatterbar segment 604 that is shortened with respect to the nominal length of each scatterbar segment 604. An end view 614 of the scatterbar 602 and wafer 610 is provided to illustrate that diffraction can occur in more than one plane. Light 606 is also diffracted from the edges of the scatterbar segments 604 in a second dimension. As a result of diffraction at the edges 608 of the scatterbar segments 604, light incident on the wafer 610 can expose images 612 of each scatterbar segment 604, wherein each image 612 is narrower with respect to the nominal width of each scatterbar segment 604 in the mask.

Although the mask pattern feature can be rectangular in shape, a resulting printed image 612 can be an oval shape as a result of line-end pull back and corner rounding. If the discrete scatterbar segments 604 are reduced further in size, then, in accordance with an aspect of the subject invention, diffracted light can meet and/or overlap on the wafer such that no image of the mask features will be resolved by the imaging system (e.g., no image will be exposed and no resist residue will be formed on a resist layer, . . . ) as depicted with regard to the relatively smaller discretized scatterbar 622.

Discretized scatterbar 622 is comprised of a series of discrete scatterbar segments 624, each of which is shorter in length than the segments 604 of scatterbar 602. As light 626 passes by the discrete scatterbar segments 624, the light 626 is diffracted at edges 628 of each of the discrete scatterbar segments 624. As a result of diffraction at the edges 628 of the shorter scatterbar segments 624, diffracted light incident on wafer 630 can meet or overlap. Consequently, an image 632 of each scatterbar segment need not be exposed and no resist residue need be formed.

An end view 604 provides an illustration of the end of scatterbar 622, wherein light 626 is diffracted from the edges of the scatterbar segments in at least a second dimension. As a result of diffraction at the edges of the scatterbar segments 624, light incident on the wafer 630 can normally expose an image 632 of each scatterbar segment, wherein the image is narrower than a nominal width of each segment 624 in the mask. However, in this case, no image will be exposed as a result of the line-end pull back in a first dimension, as illustrated by overlapping diffracted exposure light at points 632.

Figure 7:
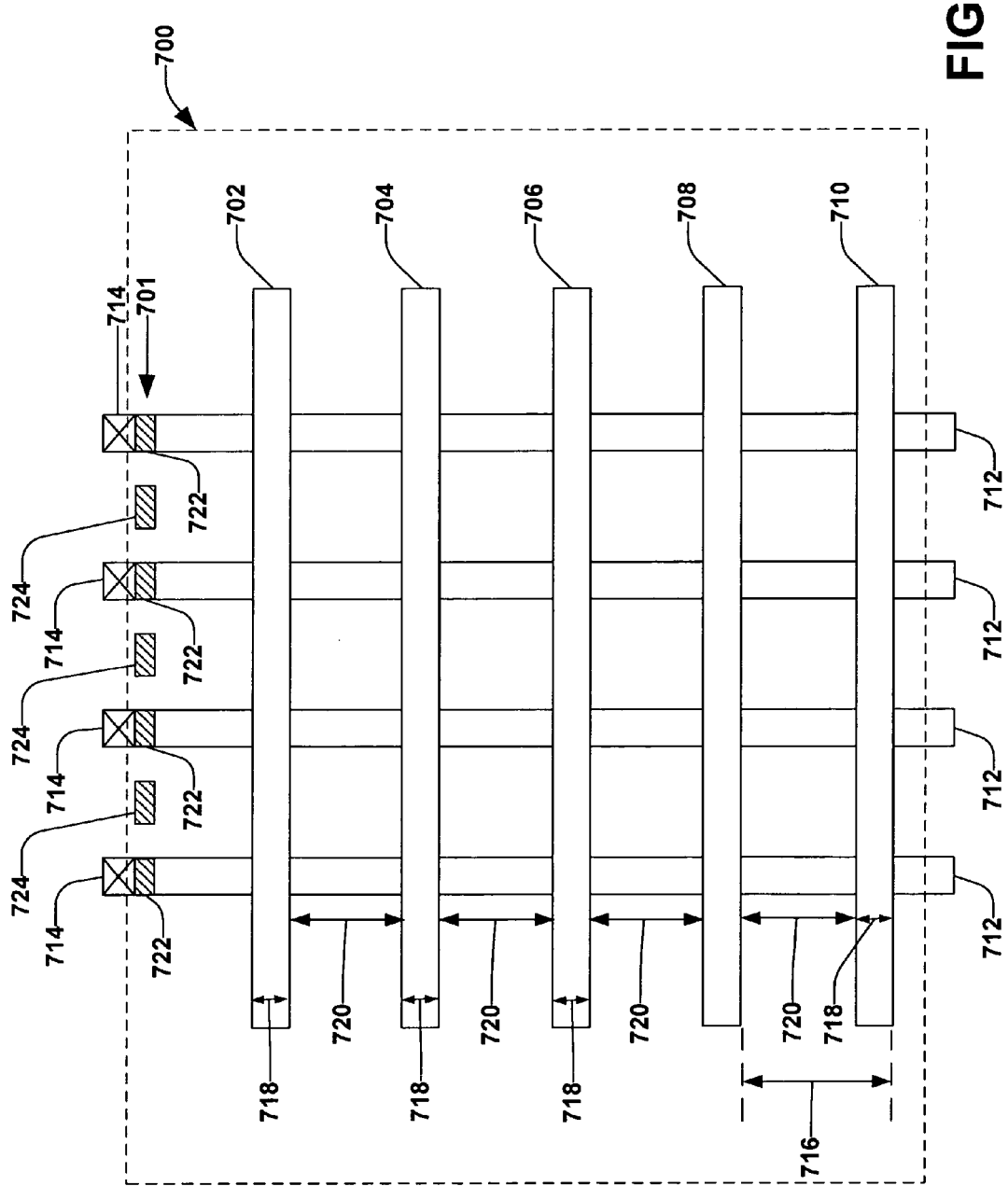
FIG. 7 illustrates a mask comprising a discretized scatterbar with a series of discrete scatterbar segments in accordance with an aspect of the subject invention.

FIG. 7 illustrates one example of a discretized scatterbar comprised of a series of discrete scatterbar segments in accordance with an aspect of the subject invention. In FIG. 7, a discretized scatterbar 701 can utilized in the formation of a series of wordlines wherein a last wordline is to be formed adjacent to a series of critical features, such as, for example, bitline contacts 714. FIG. 7 illustrates a mask 700 comprised of pattern features 702, 704, 706, 708, 710 for wordline generation. The mask 700 is positioned above a wafer comprised of bitlines 712 with contacts 714. A pitch 716 of the wordline pattern features 702, 704, 706, 708, 710 is comprised of a line width 718 plus a spacing 720 between adjacent wordlines. In this arrangement, wordline feature 702 adjacent to contacts 714 retains a common line width 718 with the balance of the wordline features 704, 706, 708, 710. Furthermore, the spacing 720 between wordline feature 702 and adjacent wordline feature 704 is retained at a dimension consistent with the spacing between other adjacent pairs of wordline features. The mask 700 further, comprises the discretized scatterbar 701. Discretized scatterbar 701 comprises a first series of discrete scatterbar segments 722 positioned directly above the bitlines 712, and further positioned adjacent to the contacts 714, between the contacts 714 and wordline feature 702. Discretized scatterbar 701 further comprises a second series of discrete scatterbar segments 724 positioned between adjacent bitlines 712 and in line with discrete scatterbar segments 722.

The discrete nature of the discrete scatterbar segments 722 and 724 of discretized scatterbar 701 mitigates the formation of a resist residue that is often associated with a contiguous scatterbar. The placement and dimensions of the discretized scatterbar segments 722 and 724 can be selected such that images associated with scatterbars 722 and 724 will not be printed onto the resist layer, and furthermore will not result in the formation of resist residue, which can limit yield of a resulting wafer. The individual discrete segments 722 and 724 can be designed with a length and/or width small enough that line-end pull back resulting from light passing by the end of each of the discrete scatterbar segments 722 and 724 can be manipulated such that images of the individual segments 722 and 724 will not be resolved by the imaging system. The placement of the series of discrete scatterbar segments 722 and 724 provides the benefits of a change in pitch to the optical system with respect to wordline feature 702 and scatterbar 701 such that the printing of the wordline feature 702 will result in a wordline having critical dimensions more aligned with the critical dimensions of non-terminal wordlines. Furthermore, in accordance with an aspect of the subject invention, the undesirable formation of resist residue is mitigated as a result of the line-end pull back caused by diffraction of the light at the ends of each of the discretized scatterbar segments 722 and 724.

Figure 8:
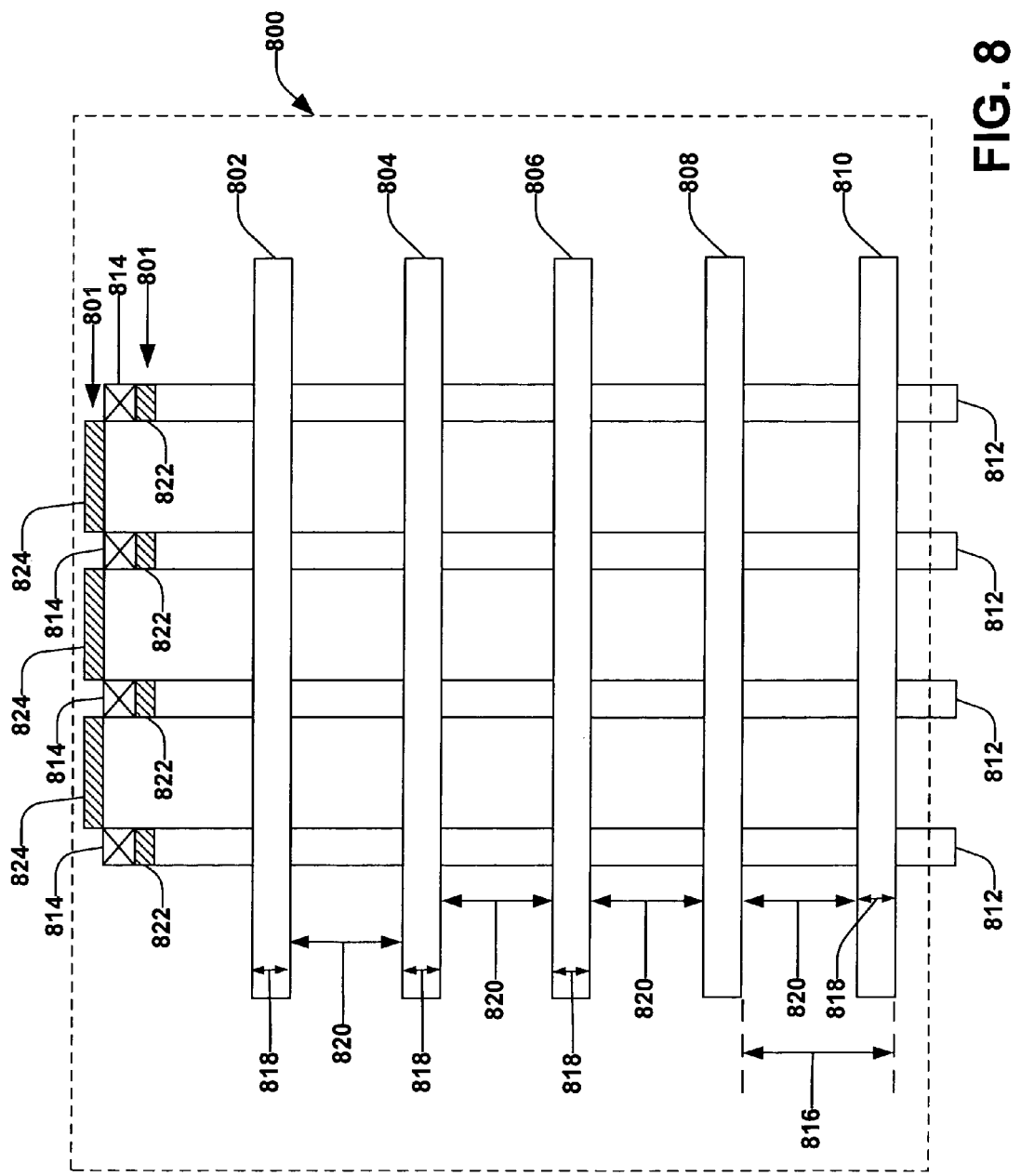
FIG. 8 illustrates a photomask comprising a discretized scatterbar with a series of discrete scatterbar segments in accordance with an aspect of the subject invention.

FIG. 8 illustrates another example of a discretized scatterbar in accordance with an aspect of the subject invention. A mask 800 comprises wordline pattern features 802, 804, 806, 808, 810. The mask 800 is positioned above a wafer comprised of bitlines 812 and contacts 814. A pitch 816 of the wordline features 802, 804, 806, 808, 810 is comprised of a line width 818 plus a spacing 820 between adjacent wordline features. In this arrangement, terminal wordline feature 802 adjacent to contacts 814 retains common line width 818 with the balance of the non-terminal wordline features 804, 806, 808, 810. Furthermore, the spacing 820 between wordline feature 802 and adjacent wordline feature 804 is retained at spacing consistent with the spacing between other adjacent pairs of wordline features.

The mask 800 further comprises a discretized scatterbar 801. Discretized scatterbar 801 is comprised of a first series of discrete scatterbar segments 822 positioned directly above the bitlines 812, between the contacts 814 and terminal wordline feature 802, adjacent to the contacts 814 on the side of the contacts closest to the wordline feature 802. Discretized scatterbar 801 is further comprised of a second series of discrete scatterbar segments 824 positioned between adjacent bitlines 812, and further positioned adjacent to the contacts 814 on the side of the contacts farthest from the wordline feature 802.

The placement and dimensions of the discretized scatterbar segments 822 and 824 are selected such that the scatterbar segments will not be printed onto the resist layer, which in turn can mitigate formation of resist residue that can negatively affect wafer process yield. The placement of the series of discrete scatterbar segments 822 and 824 provides the benefits of a decrease in pitch to the optical system with respect to wordline feature 802 and scatterbar 801, such that the printing of a wordline corresponding to wordline feature 802 will be more consistent with the balance of the wafer features with regard to critical dimensions, etc. According to one aspect of the subject invention, the discrete scatterbar segments 822 and 824 are sized to ensure that they are not resolved the imaging system, which can be achieved through line-end pull back. Further, in accordance with this aspect, the undesirable formation of resist residue is mitigated as a result of the line-end pull back caused by diffraction of the light at the ends of each discrete scatterbar segment 822 and 824.

In accordance with another aspect of the subject invention, the discrete scatterbar segments 822 and 824 can be positioned with their length running in a direction perpendicular to an axis of a dipole illumination source. For example, a dipole illumination source can be utilized such that the resolution of the imaging system in an axis perpendicular to the dipole will be less than the resolution in a direction parallel to the axis of the dipole. This disparity in resolution allows for a tight pitch to be used for placement of a series of features, such as, for example, wordlines, while the same pitch can be used for scatterbar segments running perpendicular to the axis of the dipole without being resolved by the imaging system. The lack of resolution in the direction perpendicular to the axis of the dipole allows for the scatterbar feature sizes to be on the same order in length as the width of an underlying bitline, yet still be unresolved by the imaging system, thereby avoiding the creation of a printed feature associated with a scatterbar segment, which further mitigates formation of a resist residue.

The disparity in resolution can be considered when an illumination source provides different resolutions in different directions. For instance, placement of discrete scatterbar segments such as discrete scatterbar segment 822 between wordline feature 802 and contacts 814, immediately adjacent to contacts 814 and directly over bitlines 812, ensures that critical dimension requirements for a wordline generated via terminal feature 802 in the vicinity of contacts 814 will be satisfied without creating an undesirable resist residue associated with the scatterbar segments.

Moreover, discretized scatterbars having forbidden pitches can be utilized to avoid resolution and/or imaging of scatterbar features and formation of resist residue. Forbidden pitches are pitches that result in a degradation of the process window for a lithographic imaging system. The addition of assist features to alter the apparent density and pitch as seen by the projection system can result in a sudden reduction or downward spike in the process window for a given span of pitches. The pitch values where the process window has a downward spike and falls below a threshold value are referred to as forbidden pitches, as detailed infra with regard to FIG. 9.

Figure 9:
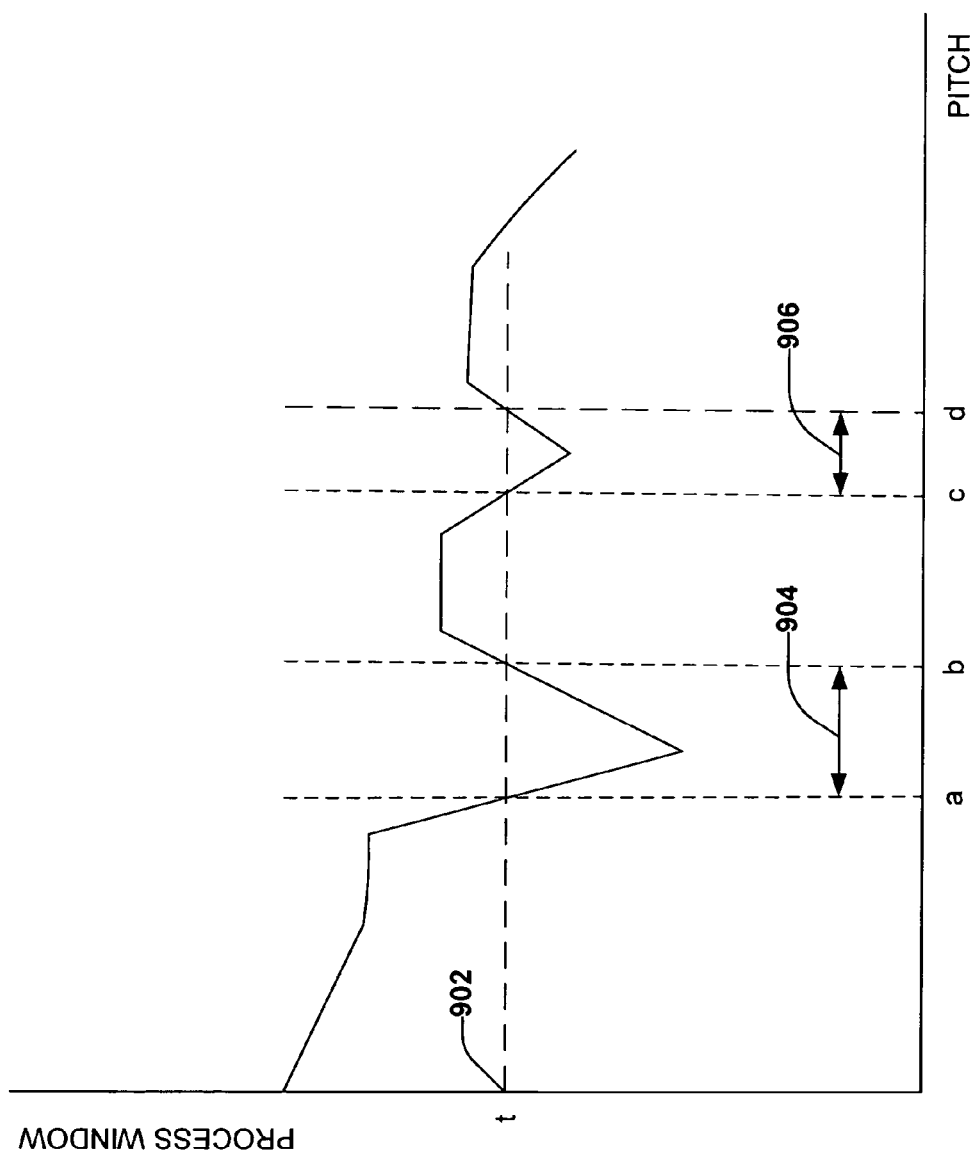
FIG. 9 is a plot of a process window as a function of pitch.

FIG. 9 is a plot of a process window as a function of pitch. As illustrated, the process window is a nonlinear function with respect to pitch. For a given lithographic imaging process, there is a threshold value "t", 902 for the process window, above which successful imaging can be realized and below which ineffective imaging of features is exhibited. The process window falls below the threshold value "t" for a first span of pitches 904 between "a" and "b," and further for a second span of pitches 906 between "c" and "d". Features spaced such that resulting pitches fall either between "a" and "b" or between "c" and "d" will not be successfully resolved by an imaging system. For this reason and in this illustration, the pitch values associated with span 904 and span 906 are referred to as "forbidden pitches."

These pitches are "forbidden" for use in a layout of a mask pattern to be utilized to transfer a desired image to a wafer because of the noted reduction in the process window at such pitches. Features placed at such forbidden pitches will not be resolved by the optical system and therefore will not be exposed on the resist layer during the imaging process. However, although such pitches are not employed to generate desired wordline patterns on a wafer, a discretized scatterbar with discrete scatterbar segments placed at forbidden pitches can be utilized to mitigate undesired resist residue, which can otherwise have a deleterious affect on the yield of the resulting processed image while still providing the benefits of improved critical dimension control.

Figure 10:
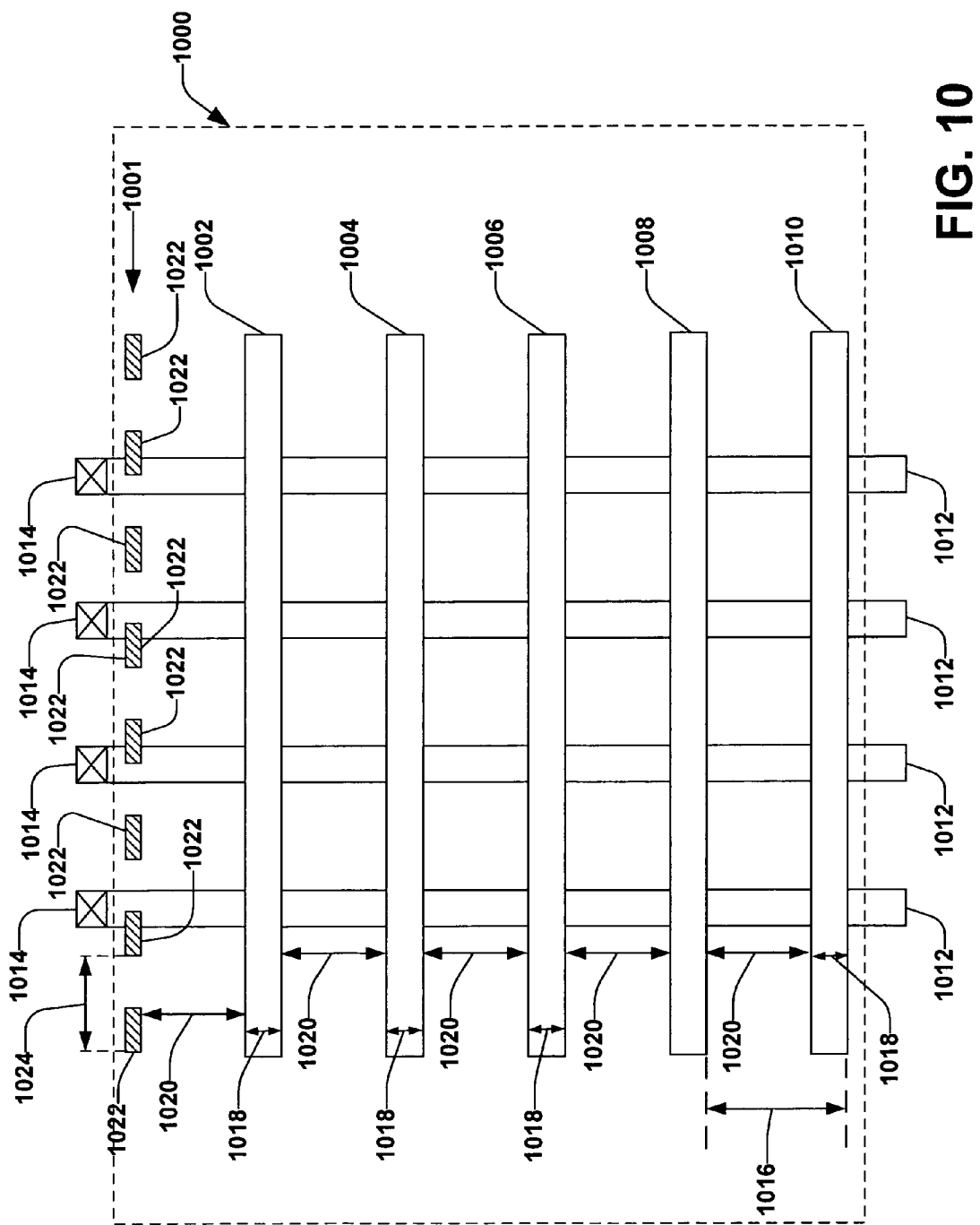
FIG. 10 illustrates one example of the placement of a discretized scatterbar comprised of a series discrete scatterbar segments in accordance with an aspect of the subject invention.

FIG. 10 illustrates one example of the placement of a discretized scatterbar comprised of a series of discrete scatterbar segments in accordance with an aspect of the subject invention. A discretized scatterbar 1001 is utilized in the formation of a series of features, such as, for example, wordlines, wherein a terminal wordline is formed adjacent to a series of critical features, such as, for example, bitline contacts present in an underlying wafer. It is understood that although wordlines are used in this illustration, the situation applies for any repetitive series of features. Further, although bitline contacts are used in this illustration, it is understood that the situation applies to the existence of any feature that interrupts a pitch associated with the series of repetitive features, such as, for example, wordlines. FIG. 10 illustrates a mask 1000 comprised of wordline features 1002, 1004, 1006, 1008, 1010. The mask is positioned above a wafer comprising bitlines 1012 and contacts 1014. A pitch 1016 of the wordline features 1002, 1004, 1006, 1008, 1010 is comprised of a line width 1018 plus a spacing 1020 between adjacent wordline features. In this arrangement, a wordline image formed by terminal wordline feature 1002 can retain a line width 1018 common to the balance of wordline images formed by pattern features 1004, 1006, 1008, 1010. Furthermore, the spacing 1020 between wordlines formed by feature 1002 and adjacent wordline feature 1004 can be retained at a dimension consistent with the spacing between other adjacent pairs of wordlines.

The mask 1000 for generating wordline images through the wordline features 1002, 1004, 1006, 1008, and 1010 can further comprise a discretized scatterbar 1001. Discretized scatterbar 1001 is comprised of a series of discrete scatterbar segments 1022 positioned near contacts 1014, between the contacts 1014 and the wordline feature 1002.

In accordance with an aspect of the subject invention, the dimensions of the discrete scatterbar segments 1022 and the spacing between the discrete scatterbar segments can be selected such that the scatterbar segments 1022 can comprise a forbidden pitch and will therefore not be printed onto the resist layer, thus mitigating formation of resist residue, which can limit yield on the resulting wafer. The discrete nature of discretized scatterbar 1001 prohibits the formation of a resist residue that is often associated with a contiguous scatterbar. A pitch 1024 of the discrete scatterbar segments 1022 comprised by the scatterbar 1001 is selected such that the pitch 1024 lies within a span of forbidden pitches for the imaging system, as detailed above with regard to FIG. 9. Because the spacing and dimensions of the discrete scatterbar segments 1022 fall within a forbidden pitch range, individual discrete scatterbar segments 1022 will not be resolved by the imaging system or printed in a resist layer of the wafer. Furthermore, no resist residue will be formed in the resist layer of the wafer. The placement of the series of discrete scatterbar segments 1022 provides the benefits of a decrease in pitch to the optical system with respect to the terminal wordline feature 1002 and the discretized scatterbar 1001, such that a wordline associated with terminal feature 1002 can exhibit critical dimensions that are consistent with the balance of the wordlines generated via non-terminal wordline features. Furthermore, undesirable formation of resist residue is avoided as a result of placing the discrete scatterbar segments at a forbidden pitch of the imaging system.

Figure 11:
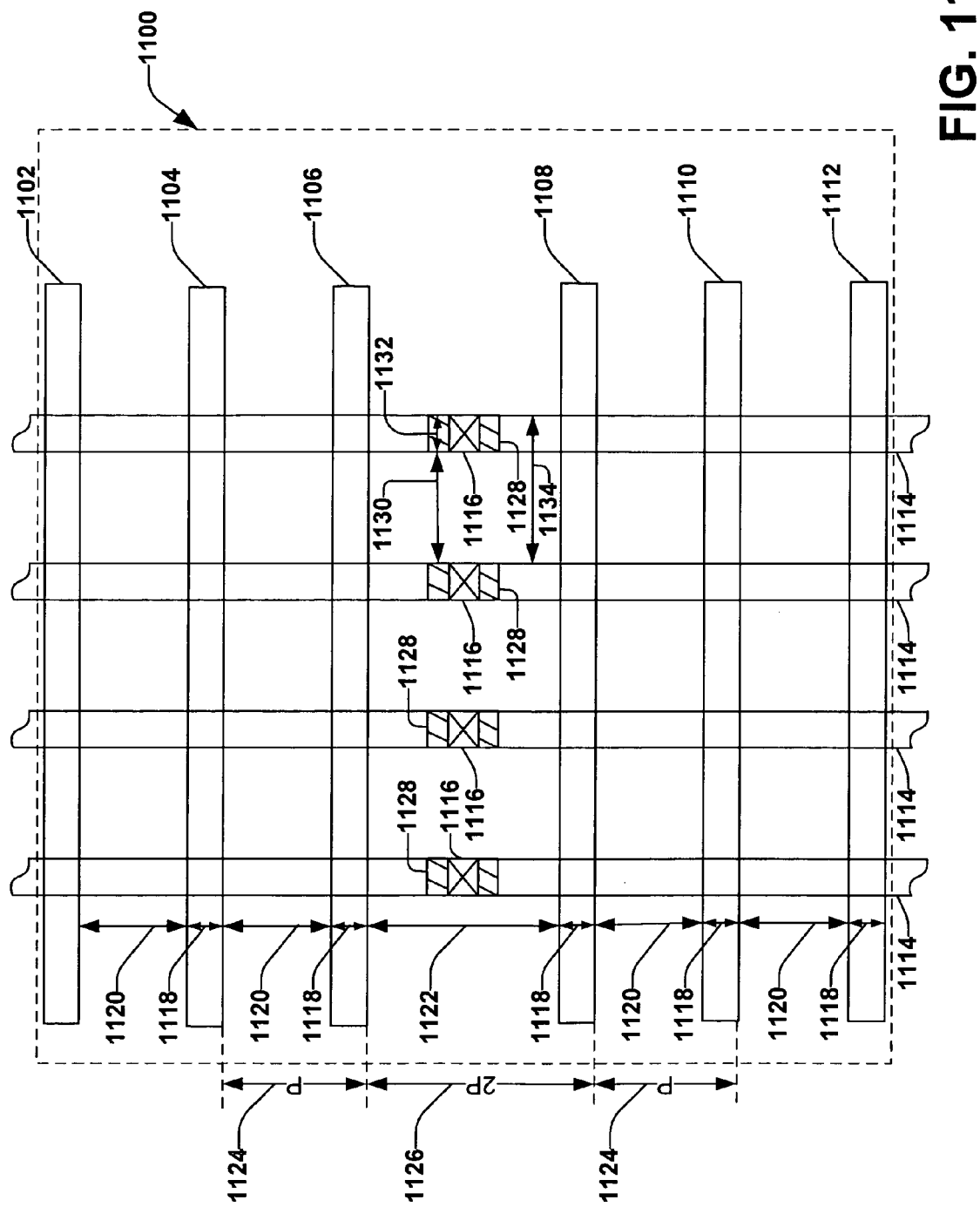
FIG. 11 is an illustration of a mask comprising a discretized scatterbar having a series discrete scatterbar segments in accordance with an aspect of the subject invention.

FIG. 11 is an illustration of another discretized scatterbar in accordance with an aspect of the subject invention, wherein a grating can be placed perpendicular to wordline features on a mask. The pitch of the discrete features comprising the grating is the same as the bitline pitch such that the discrete grating elements can be aligned directly above the contacts. According to the figure, a mask 1100 comprising wordline features 1102, 1104, 1106, 1108, 1110 and 1112 can be positioned above a bitlines 1114 and contacts 1116 on a wafer. Each of the wordline features 1102, 1104, 1106, 1108, 1110 and 1112 comprise the same critical dimension line width 1118. The line width 1118 and the spacing 1120 between wordline features 1108 and 1110 results in a pitch, "P", 1124. A common spacing 1120 exists between wordline features 1102 and 1104, 1104 and 1106, 1108 and 1110, and 1110 and 1112. However, the spacing 1122 between wordline features 1106 and 1108 results in a pitch, "2P", 1126, that is twice the pitch associated with adjacent pairs of wordline features.

Normally, this increase in pitch would have a deleterious effect on the imaging of wordlines via wordline features 1106 and 1108. However, in accordance with an aspect of the subject invention, mask 1100 further comprises a series of discrete grating elements 1128 positioned directly above the underlying contacts 1116. Contacts 1116 are shown for clarity, but are understood to be underneath the grating elements 1128. The presence of the grating elements 1128 alters the pitch as seen by an imaging system with respect to the wordline features 1106 and 1108. The presence of the grating elements provides diffraction interactions that mimic diffraction that would occur if wordline feature were present at a location above the contacts 1116 at a constant pitch. The diffraction interactions result in wordline features 1106 and 1108 being printed to form wordline images with a consistent set of critical dimensions, similar to the results that would be obtained if an additional wordline feature were in fact present between wordline features 1106 and 1108 at pitch "P".

In the illustrated example of FIG. 11, the width 1130 of the grating elements and spacing 1132 between the individual grating elements are such that the grating element pitch is the same as the bitline pitch 1134. In accordance with one aspect of the subject invention, the size and spacing of the grating elements match the bitline pitch, with the size of the grating elements being such that the grating elements will not be resolved by the imaging system due to the effects of line-end pull back. In accordance with another aspect of the present invention, the pitch of the grating elements matches the bitline pitch, and the grating element pitch falls with a span of forbidden pitches such that the grating elements will not be resolved by the imaging system. In accordance with yet another aspect of the present invention, the pitch of the grating elements matches the bitline pitch and the grating element pitch takes advantage of a lack of resolution in a direction perpendicular to an axis of a dipole illumination source such that the grating elements will not be resolved by the imaging system. It is understood, however, that a pitch different than the bitline pitch can be used for the grating elements. In another implementation, the pitch of the grating elements is different than the bitline pitch, but the size and spacing of the grating elements are at a forbidden pitch in the bitline direction such that the imaging system will not resolve the individual grating elements. In all of these implementations, the size and spacing of the grating elements are selected so that they will not be resolved by the imaging system, either due to line-end pull back, because of a lack of resolution in an axis perpendicular to an axis of a dipole illumination source, or because the grating elements are positioned and spaced at a forbidden pitch. It is further understood that the size and spacing of the grating elements can be selected such that they will not be resolved by the imaging system as a result of any combination of line-end pull back, lack of resolution in an axis perpendicular to an axis of a dipole illumination source, or grating elements positioned and spaced at a forbidden pitch. Accordingly, in all of these situations, the grating elements are not resolved by the imaging system, and therefore are not printed on the resist layer of the wafer, which in turn can mitigate formation of a resist residue on the wafer.

Size, spacing, and placement of the discrete scatterbar segments can be determined through simulation. The diffraction interactions of light passing through a mask are complex, and simulations can aid in determining an optimal placement of discrete scatterbar segments. In accordance with another aspect of the subject invention, simulation is used to determine a depth of focus for an imaging system employed in conjunction with a discretized scatterbar, etc.

Figure 12:
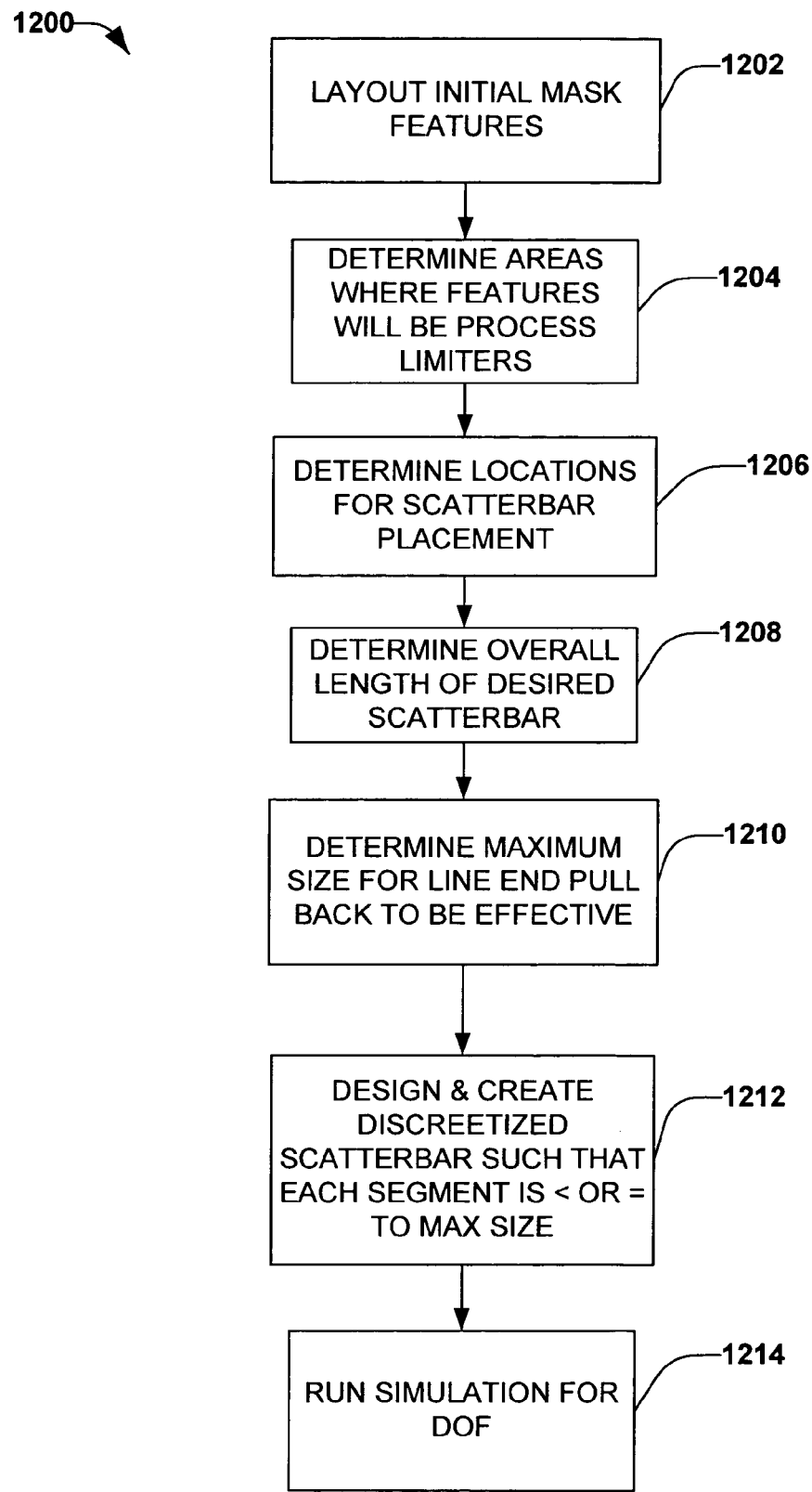
FIG. 12 is an illustration of a methodology for improving a process margin of a lithographic system in accordance in accordance with an aspect of the subject invention.
Figure 13:
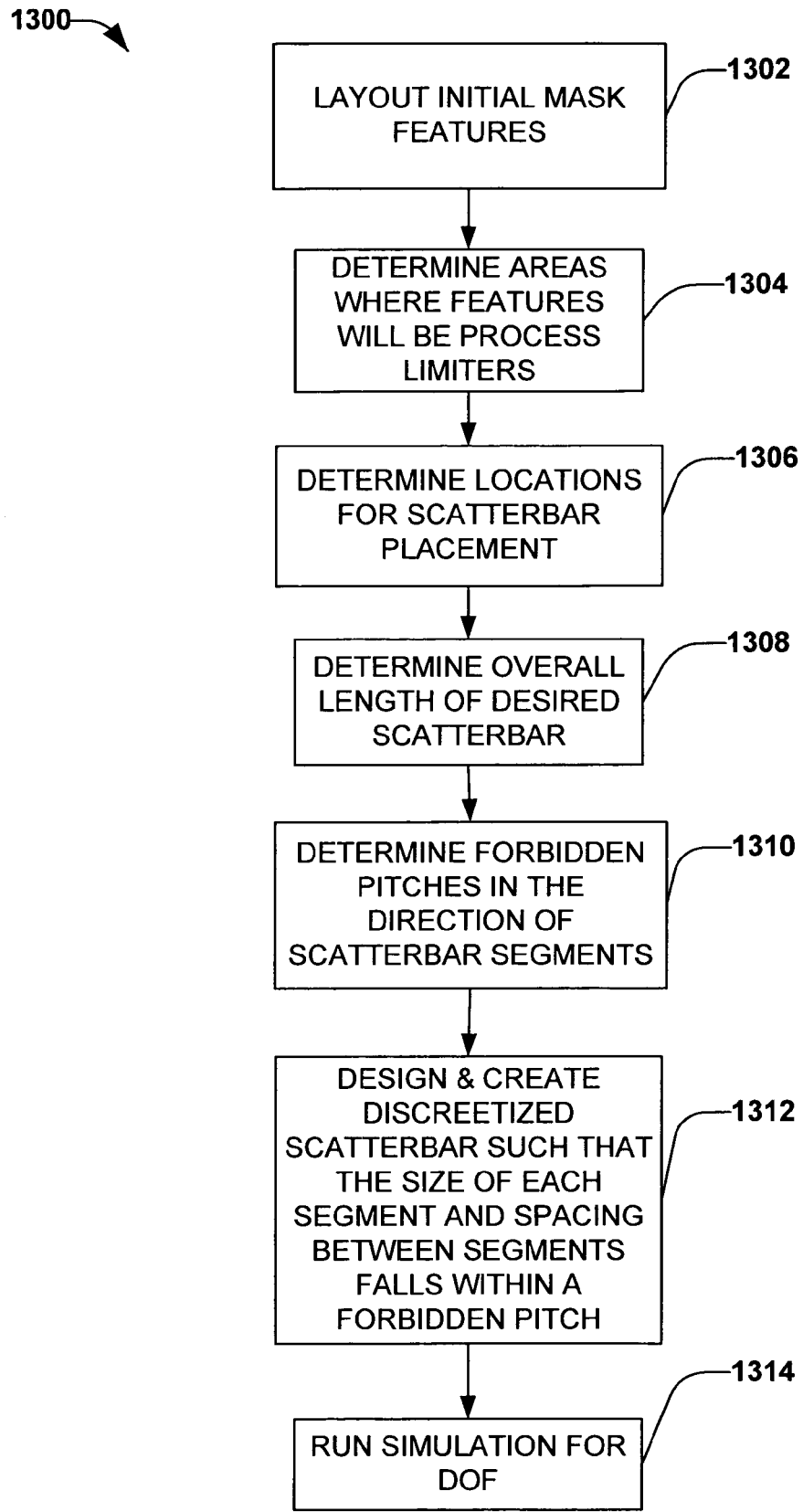
FIG. 13 is an illustration of a methodology for improving a process margin of a lithographic system in accordance in accordance with an aspect of the subject invention.

Turning briefly to FIGS. 12 and 13, methodologies that can be implemented in accordance with the subject invention are illustrated. While, for purposes of simplicity of explanation, the methodologies are shown and described as a series of blocks, it is to be understood and appreciated that the subject invention is not limited by the order of the blocks, as some blocks can, in accordance with the subject invention, occur in different orders and/or concurrently with other blocks from that shown and described herein. Moreover, not all illustrated blocks may be required to implement the methodologies in accordance with the subject invention.

FIG. 12 is an illustration of a methodology 1200 for improving a process margin of a lithographic system in accordance with an aspect of the subject invention. As illustrated, the methodology takes into consideration characteristics of the imaging system when determining the size and placement of discrete scatterbar segments to take advantage of line-end pull back to improve wafer feature formation without undesired resist residue formation.

The methodology 1200 begins at 1202, where an initial layout for a mask to be utilized in a lithographic imaging process for the manufacture of a semiconductor is created in accordance with an appropriate set of design rules consistent with the application for the given mask. At 1204, the process continues with an examination of the resulting mask to determine areas where a feature can potentially become a process window limiter in the absence of some alteration of the mask. Such areas include, but are not limited to, for example, a break in a pitch associated with a repetitive set features, such as, for example, a series of wordline pattern features to be utilized in the formation of wordlines in a memory component. A break in the pitch can be a result of the presence of undesirable critical features, such as, for example, existing contacts in a semiconductor wafer upon which the mask pattern is to be transferred. Although a repeating pattern of features for wordline formation is used in this example, it is understood that the methodology 1200 can be applied to any series of features where a change in pitch is desired. Furthermore, although the critical features illustrated in this methodology are contacts, it is understood that critical features can be any features that require a change in the pitch.

At 1206, a selection of an appropriate location for placement of a discretized scatterbar can be made. The selected location facilitates a change in the environment near a wordline pattern feature, or other feature in question, such that the pitch as seen by the imaging system will mimic pitches for common mask features (e.g., features that do not require pitch adjustment, . . . ). The location selected can be adjacent to the suspect feature at the same or a substantially similar pitch associated with common mask features. At 1208, an overall length of the discretized scatterbar can be determined. In the illustrated example, the overall length of the scatterbar can be a length consistent with a length of an adjacent wordline feature.

At 1210, a maximum size for individual discrete scatterbar segments can be determined, such that segments will not be resolved by the imaging system, which can be facilitated by employing knowledge of an expected amount of line-end pull back for a given feature size, etc. A maximum size can be a function of numerous factors including, but not limited to: wavelength of the exposure light; distance between the mask and the wafer upon which the pattern is to be transferred; illumination scheme being utilized, such as, for example, monopole, dipole, quadrupole, annual, on axis, off axis, etc.; quality, size, and placement of the lenses, mirrors, and other components of the optical system; etc. Once the location, overall length, and maximum size of the discrete scatterbar segments has been determined, then at 1212 a discretized scatterbar can be designed and created such that each segment of the discretized scatterbar will be no larger than the maximum size identified at 1210. The resulting scatterbar will provide the beneficial diffraction effects required to allow the imaging of wordline(s) or feature(s) in question with critical dimensions similar to dimensions observed in denser areas of the mask. By taking advantage of the effects of line-end pull back, individual discrete scatterbar segments will not be resolved, avoiding the formation of resist residue, which can ultimately negatively impact the performance and yield for the semiconductor wafer in question. For instance, the maximum size for a scatterbar segment can be smaller than a threshold size at which imaging of the scatterbar segment can occur, to ensure that the line-end pull back phenomenon can occur to mitigate resist residue accrual. The process can be repeated from steps 1204 through 1212 for additional areas containing features that can be potential process limiters until all areas have been considered. Finally, at 1214, simulations can be run on the resulting mask inclusive of the discretized scatterbars to determine the overall process window and depth of focus for the system.

FIG. 13 is an illustration of a methodology 1300 for improving a process margin of a lithographic system in accordance with an aspect of the subject invention. As illustrated, the methodology takes into consideration characteristics of the imaging system when determining the size and placement of discrete scatterbar segments to take advantage of "forbidden" pitches.

The methodology begins at 1302, where an initial layout for a mask to be utilized in a lithographic process for the manufacture of a semiconductor is created in accordance with an appropriate set of design rules consistent with the application for the given mask. At 1304, the process continues with an examination of the resulting mask to determine areas where a feature can become a process window limiter in the absence of some alteration of the mask. Such areas include, for example, but are not limited to, a break in the pitch associated with a repetitive set features, such as, for example, a series of wordlines used the manufacture of a memory component. A break in the pitch can be a result of the presence of critical features to be avoided, such as, for example, existing contacts in the semiconductor wafer upon which the mask pattern is to be transferred. Although mask features associated with wordlines are used in this example, it is understood that the methodology can be applicable to any series of features where a change in pitch is desired. Furthermore, although contacts are used in this illustration, it is understood that the critical features can be any extant wafer features that require a change in the pitch for any series of features in the mask.

At 1306, the process continues with selection of an appropriate location for the placement of a discretized scatterbar. The selected location facilitates a change in the environment near the mask feature in question such that the pitch of the feature as seen by an imaging system will result in a more uniform critical dimensions of an image on the wafer that corresponds to the mask feature. This location can often be adjacent to the mask feature in question (e.g., a feature for which an altered pitch is desired, . . . ) to generate a pitch that is substantially similar to a pitch associated with the rest of the mask features (e.g., mask features remote from a critical wafer feature, such as a contact, . . . ).

At 1308 an overall length of the discretized scatterbar can be determined. In the illustrated example, the overall length of the scatterbar can be a length consistent with the length of the adjacent mask feature for which pitch alteration is desired.

At 1310, a range of pitches representing forbidden pitches of the imaging system in the direction of the series of scatterbar segments can determined. Based on the set of forbidden pitches, a pitch for the discrete scatterbar segments can be chosen such that the pattern created by the series of scatterbar segments falls within the range of forbidden pitches and therefore falls below a threshold value for process window of the imaging system. The resulting pitch is a function of the length of the individual segments and the spacing between consecutive segments. The forbidden pitches can be function of numerous factors including, but not limited to: wavelength of the exposure light; distance between the mask and the wafer upon which the pattern is to be transferred; illumination scheme used, such as, for example, monopole, dipole, quadrupole, annual, on axis, off axis, etc.; quality, size, and placement of the lenses, mirrors, and other components of the optical system; etc. Once the location, overall length, discrete segment size, and spacing between the discrete scatterbar segments has been determined, then at 1312, a discretized scatterbar can be designed and created such that each segment of the discretized scatterbar creates a pitch that falls within the span of forbidden pitches of the imaging system, which in turn can facilitate ensuring that the scatterbar segments are not imaged on the wafer during application of an exposure technique. The resulting scatterbar can provide beneficial diffraction effects that allow imaging of the wordline or feature in with critical dimensions that are consistent with other wordlines or features having corresponding mask features that are not subject to pitch alteration. Moreover, because forbidden pitches are pitches that are not resolvable by the particular imaging system in which they are employed, the individual discrete scatterbar segments will not be resolved, which facilitates mitigating formation of resist residue that can ultimately negatively impact the performance and yield for the semiconductor wafer. The process can be repeated from steps 1304 through 1312 for additional areas containing features that can be potential process limiters until all areas have been considered. Finally, at 1314, simulations can be run on the resulting mask inclusive of the discretized scatterbars to determine an overall process window and depth of focus for the system.

Although methodology 1200 addresses formation of a discretized scatterbar to take advantage of line-end pull back, and methodology 1300 addresses formation of a discretized scatterbar that utilizes forbidden pitches, it is understood that the two methodologies can be combined to create a discretized scatterbar comprising the benefits of both methodologies. Furthermore, other considerations, such as, for example, lack of resolution in an axis perpendicular to a dipole illumination source can also be considered in lieu of or in conjunction with either methodology in the determination of the size, placement, and orientation of the discrete scatterbar segments.

What has been described above includes examples of the subject invention. It is, of course, not possible to describe every conceivable combination of components or methodologies for purposes of describing the subject invention, but one of ordinary skill in the art can recognize that many further combinations and permutations of the subject invention are possible. Accordingly, the subject invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method of improving a process margin of a lithographic imaging system, comprising:
   identifying a semi-isolated pattern feature on a mask as a potential limiting factor to a process margin for a lithographic imaging technique;
   determining a resolution threshold for the imaging technique;
   determining a maximum size threshold for discrete scatterbar segments based at least in part on the determined resolution threshold for the imaging system and a known amount line-end pull back that occurs at the resolution threshold; and
   mitigating a resist residue by placing a discrete scatterbar comprising more than one discrete sub-resolution scatterbar segment near the semi-isolated mask feature
   Constructing the more than one discrete scatterbar segments with a pitch outside of a range of pitches that can be resolved perpendicular to an axis of a dipole illumination source, and within a range of pitches that can be resolved parallel to the axis of the dipole illumination source, and orienting the discrete scatterbar perpendicular to the axis to mitigate discrete scatterbar segments resolution by the imaging system.

2. The method of claim 1, further comprising constructing the more than one discrete scatterbar segments to be about the maximum threshold size in only one dimension transverse to incident illumination and larger than the maximum threshold size in a second transverse direction.

3. The method of claim 1, the at least one semi-isolated mask feature comprises a terminal feature in a series of mask features of uniform pitch.

4. The method of claim 3, the terminal feature comprises a mask pattern feature for imaging a wordline and the series of mask features comprises a series of mask pattern features for imaging a series of wordlines.

5. The method of claim 3, the terminal feature comprises a mask feature for imaging a bitline and the series of mask features comprises a series mask features for imaging a series of bitlines.

6. The method of claim 2, further comprising running a simulation for a depth of focus for the imaging system.

7. The method of claim 1, further comprising constructing the more than one discrete scatterbar segments with one or more pitches comprising forbidden pitches of the imaging system.

8. A photomask comprising:

one or more semi-isolated mask features; and one or more discretized scatterbars positioned near at least one of the one or more semi-isolated mask features, the one or more discretized scatterbar comprises more than one discrete sub-resolution scatterbar segment wherein each of the more than one discrete sub-resolution scatterbar segments is constructed smaller than a predefined maximum segment size threshold in only one transverse direction to incident illumination and based on a determined line-end pull, below which the imaging system does not generate an image, the discretized scatterbars alter a pitch of the one or more semi-isolated mask features and mitigate photoresist residue after an exposure period.

9. The mask of claim 8, wherein the more than one discrete sub-resolution scatterbar segments comprise a forbidden pitch that is not resolvable by the imaging system.

10. The mask of claim 8, wherein the more than one discrete sub-resolution scatterbar segments comprise a pitch formed in an axis perpendicular to an axis of a dipole illumination source employed to expose a photoresist through the mask.

11. The mask of claim 8, at least one of the one or more semi-isolated mask features comprises a last feature in a series of uniformly sized and spaced features.

12. The mask of claim 11, the mask features form a pattern through which an exposure source can illuminate a photoresist on a wafer to generate an image of a pattern of word lines thereon.

13. A system that facilitates improving wafer yield after a photoresist exposure technique, comprising:

means for identifying a potential yield-limiting pattern feature on a photomask;

means for determining a maximum size threshold for discrete scatterbar segments based at least in part on a resolution limit perpendicular to an axis of a dipole illuminator, which is poorer than a resolution limit parallel to the dipole illuminator axis; and means for mitigating a resist residue by generating a plurality of discrete scatterbar segments that are of a sub-resolution size relative the perpendicular resolution limit, and are not sub-resolution size relative the parallel resolution limit, and orienting the discrete scatterbar segments perpendicular to the axis of the dipole illuminator to mitigate scatterbar segment resolution means for constructing the more than one discrete scatterbar segments with a pitch outside of a range of pitches that can be resolved perpendicular to an axis of a dipole illumination source, and within a range of pitches that can be resolved parallel to the axis of the dipole illumination source, and orienting the discrete scatterbar perpendicular to the axis to mitigate discrete scatterbar segments resolution by the imaging system.

14. The system of claim 13, further comprising:

means for positioning the plurality of scatterbar segments adjacent to the identified pattern feature and adjusting the pitch of the identified pattern feature; and means for exposing the resist layer on the wafer through the photomask.

15. The method of claim 1, mitigating the resist residue comprises placing the discrete scatterbar perpendicular to a wordline.

16. The method of claim 1, mitigating the resist residue comprises placing the discrete scatterbar at a pitch consistent with a bitline pitch.

17. The method of claim 1, further comprising placing discrete scatterbar segments directly above bitlines.

18. The method of claim 1, further comprising placing discrete scatterbar segments between adjacent bitlines.

19. The method of claim 1, determining the maximum size threshold comprises selecting a line width narrower than a nominal line width of the semi-isolated feature such that the discrete scatterbar will not be resolved by the imaging system.

* * * * *